United States Patent [19]
Noble

[11] Patent Number: 6,072,223
[45] Date of Patent: Jun. 6, 2000

[54] CIRCUIT AND METHOD FOR A MEMORY CELL USING REVERSE BASE CURRENT EFFECT

[75] Inventor: Wendell P. Noble, Milton, Vt.

[73] Assignee: Micron Technology, Inc., Boise, Id.

[21] Appl. No.: 09/145,582

[22] Filed: Sep. 2, 1998

[51] Int. Cl.[7] .................. H01L 31/062; H01L 29/80; H01L 29/00
[52] U.S. Cl. .................. 257/390; 257/390; 257/69; 257/903; 257/273; 257/133; 257/146; 257/500; 257/501; 257/506; 257/510; 257/524
[58] Field of Search .................. 257/390, 69, 903, 257/273, 133, 146, 500, 501, 506, 510, 524

[56] References Cited

U.S. PATENT DOCUMENTS

| 5,554,870 | 9/1996 | Fitch et al. | 257/334 |
| 5,717,241 | 2/1998 | Malhi et al. | 257/378 |

OTHER PUBLICATIONS

Sakui, K., et al., "A New Static Memory Cell Based on Reverse Base Current (RBC) Effect of Bipolar Transistor" International Electron Devices Meeting. Technical Digest (IEEE Cat. No. 88CH2528–8., San Francisco, CA, 44–47, Dec. 1988.

*Primary Examiner*—Mahshid Saadat
*Assistant Examiner*—Matthew E. Warren
*Attorney, Agent, or Firm*—Schwegman, Lundberg, Woessner & Kluth P.A.

[57] ABSTRACT

A memory cell is provided. The memory cell includes a field-effect transistor having a source region, a drain region and a gate coupled to a wordline. The memory cell also includes a vertical bipolar junction transistor that is biased for use of the reverse base current effect to store data. The bipolar junction transistor has an emitter region formed within a source/drain region of the field-effect transistor. The emitter region is self-aligned with a minimum dimension isolation region adjacent to the memory cell and is coupled to a ground line. A portion of the source/drain region acts as the base of the bipolar junction transistor.

15 Claims, 7 Drawing Sheets

CIRCUIT AND METHOD FOR A MEMORY CELL USING REVERSE BASE CURRENT EFFECT

TECHNICAL FIELD OF THE INVENTION

The present invention relates generally to the field of integrated circuits and, in particular, to a circuit and method for a memory cell using reverse base current effect.

BACKGROUND

Modern electronic systems typically include a data storage device such as a dynamic random access memory (DRAM), static random access memory (SRAM) or other conventional memory device. The memory device stores data in vast arrays of memory cells. Each cell conventionally stores a single bit of data (a logical "1" or a logical "0") and can be individually accessed or addressed.

Electronic systems, e.g., computers, conventionally store data during operation in the memory device. As these systems become more sophisticated, they require more and more memory capacity to keep pace with the increasing complexity of software based applications that run on the systems. Thus, as the technology relating to memory devices has evolved, designers have tried to increase the density of memory cells in the memory device by decreasing the size of the memory cells. This allows a larger number of memory cells to be fabricated without substantially increasing the size of the semiconductor wafer that houses the memory device.

Static random access memory or "SRAM" is one type of memory device that is used with electronic systems, e.g., computers. Conventionally, an SRAM device includes an array of addressable memory cells. Each cell includes a four transistor flip-flop and access transistors that are coupled to input/output nodes of the flip-flop. Data is written to the memory cell by applying a high or low logic level to one of the input/output nodes of the flip-flop through one of the access transistors. When the logic level is removed from the access transistor, the flip-flop retains this logic level at the input/output node. Data is read out from the flip-flop by turning on the access transistor.

Some researchers have proposed an SRAM cell structure that is based on the reverse base current effect of a bipolar junction transistor. This is a two transistor cell with a bipolar junction storage transistor and a field effect transistor acting as a switch to pass voltages in and out of the cell. Essentially, this structure is capable of storing data because, when a sufficient voltage is maintained between the collector and the emitter of the bipolar junction transistor, the base current of the transistor is zero for two distinct voltages applied to its base. Typically, the bipolar junction transistor does not conduct any base current in this configuration when the base voltage is either zero volts or 0.6 volts. This allows the transistor to store two different logic states; both at essentially no current. The voltage stored on the base of the bipolar junction transistor is read using techniques similar to conventional DRAM devices.

Unfortunately, the researchers have not contemplated how to reduce the size of these cells so as to increase the density of cells of an SRAM array even further.

For the reasons stated above, and for other reasons stated below which will become apparent to those skilled in the art upon reading and understanding the present specification, there is a need in the art for an SRAM cell with reduced surface area.

SUMMARY OF THE INVENTION

The above mentioned problems with memory cells and other problems are addressed by the present invention and will be understood by reading and studying the following specification. An improved memory cell is described which occupies a reduced surface area on the substrate by using a single mask to define the location of wordlines, ground buses and isolation regions with widths at the minimum dimension (F). This single mask allows a reduction in the size of the memory cell to approximately six feature squares by self-aligning a vertical bipolar junction transistor with the minimum dimension isolation region.

Memory devices are fabricated using photolithographic techniques that allow semiconductor and other materials to be manipulated to form integrated circuits as is known in the art. These photolithographic techniques essentially use light that is focussed through lenses to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum feature size (F) of the photolithographic process.

The minimum feature size imposes one constraint on the size of conventional cells in an SRAM device. Conventionally, SRAM cells have used a surface area on a substrate that is approximately equal to 120 feature squares ($F^2$). Some researchers have used vertical transistors to reduce the size of the memory cells to as small as 32 feature squares.

In order to keep up with the demands for higher capacity memory devices, designers have dabbled with changing the mechanism of cell operation in an SRAM cell to produce SRAM cells of smaller size. For example, some researchers have used the mechanism of complementary metal-on-semiconductor (CMOS) latchup. This mechanism is a negative differential resistance phenomenon which provides two current states at the same voltage. Unfortunately, in one of these states, the SRAM cell can draw a large current. This can result in a high power consumption for large arrays of SRAM cells.

Other researchers have attempted to use the negative resistance characteristic of a tunnel diode mechanism to redesign the conventional SRAM cell. The tunnel diode device has two voltage levels for the same current. However, the tunnel diodes in such a structure may require heavy doping not normally associated with conventional CMOS fabrication techniques.

DETAILED DESCRIPTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

For purposes of this specification, the terms "chip," "wafer" and "substrate" include any structure having an exposed surface of semiconductor material with which to form integrated circuit (IC) structures. These terms are also used to refer to semiconductor structures during processing, and may include other layers that have been fabricated thereupon. The terms include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on," "side" (as in "sidewall"), "higher", "lower," "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

Figure 1:
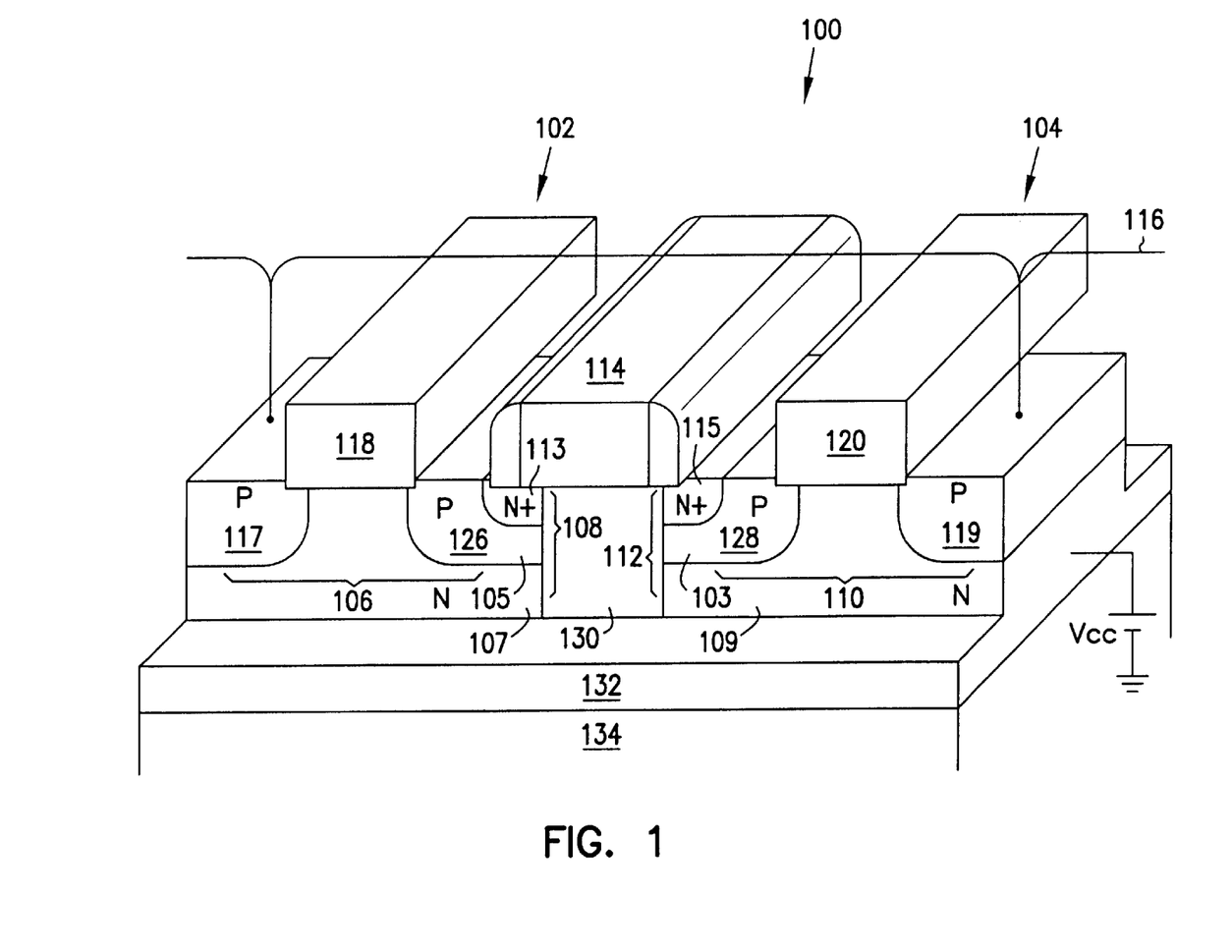
FIG. 1 is a perspective view of an embodiment of a portion of an array of static random access memory cells according to the teachings of the present invention.
Figure 2:
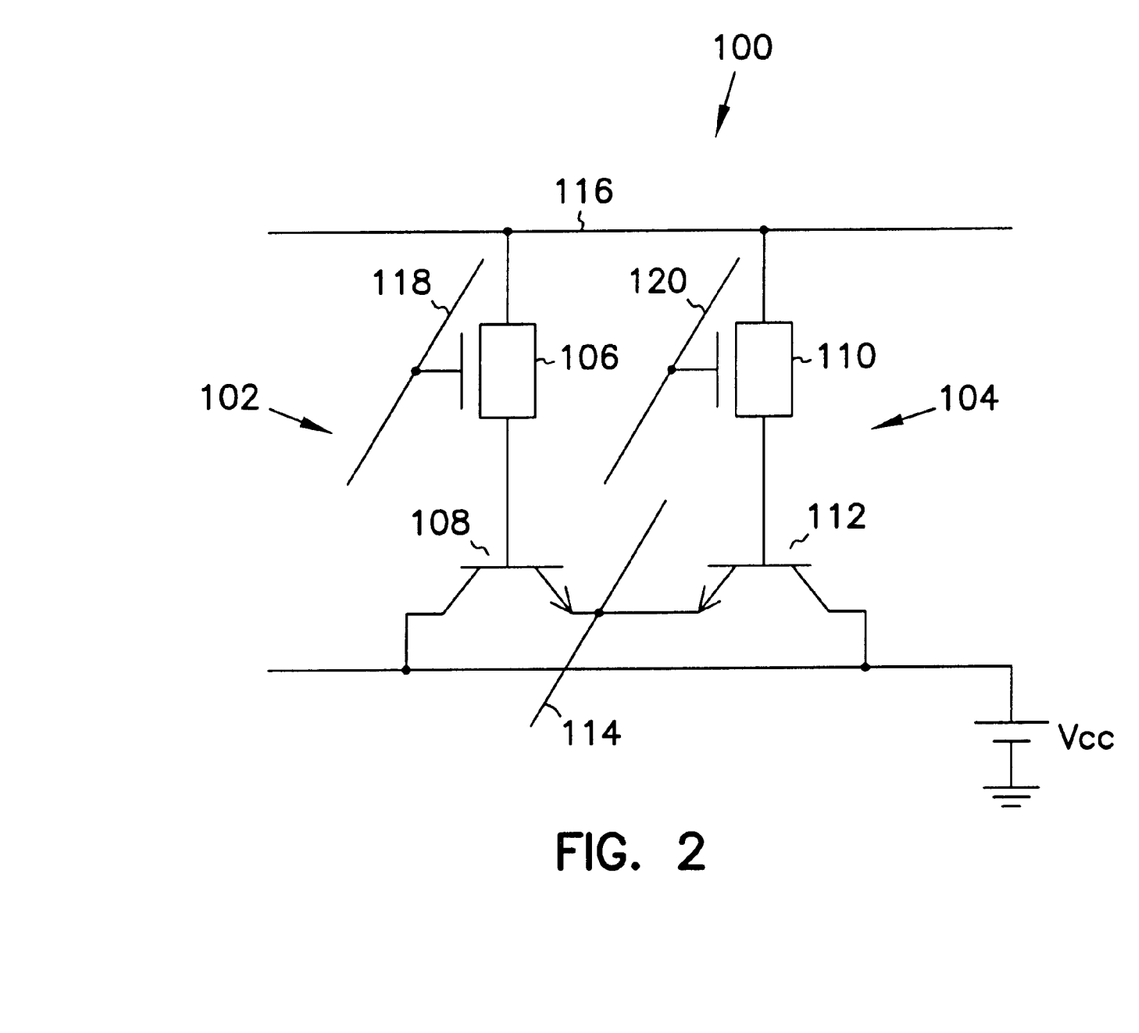
FIG. 2 is a schematic diagram of the embodiment of FIG. 1.

FIG. 1 is a perspective view of an embodiment of a portion of an array 100 of static random access memory cells according to the teachings of the present invention. FIG. 2 is a schematic view of the same portion of array 100 of FIG. 1. This portion of array 100 includes two adjacent memory cells 102 and 104. It is understood that memory array 100 is not limited to two memory cells. Any appropriate number of memory cells can be fabricated in the array for a specific application. It is noted that in the Figures, the base, collector, emitter, and source/drain regions of the various transistors are only numbered in FIG. 1. In FIG. 2, these regions are depicted by their common schematic representation.

Each memory cell includes two transistors; a field effect transistor and a bipolar junction transistor. For example, memory cell 102 includes p-channel MOS transistor 106 and n-p-n bipolar junction transistor 108. Similarly, memory cell 104 includes p-channel MOS transistor 110 and n-p-n bipolar junction transistor 112. The emitters 113 and 115 of transistors 108 and 112, respectively, are coupled together at ground line or ground bus 114. Further, the collectors 107 and 109 of transistors 108 and 112, respectively, are coupled together at a voltage labeled $V_{CC}$. The voltage drop between the collector and the emitter in each bipolar junction transistor allows the use of the reverse base current effect in the transistors to store data for the cell. Thus, transistors 108 and 112 comprise the storage nodes for their respective cells.

Transistors 106 and 110 provide access to their respective storage transistors 108 and 112. Transistors 106 and 110 include source/drain regions 117 and 119, respectively, that are coupled to bit line 116. Thus, data is read into and out of the storage transistors via the access transistors and bit line 116. Further, the base 105 of transistor 108 is coupled to source/drain region 126 of transistor 106 as described in more detail below. Similarly, the base 103 of transistor 112 is coupled to source/drain region 128 of transistor 110. A gate of transistor 106 is coupled to wordline 118 and a gate of transistor 110 is coupled to wordline 120.

The structure of array 100 allows each memory cell to be as small as six feature squares due to the self-alignment of the emitter regions of the bipolar junction transistors in the source/drain regions of the field-effect transistors with a minimum dimension isolation region. As shown in FIG. 1, emitter regions 113 and 115 are self-aligned in source/drain regions 126 and 128, respectively, with shallow trench isolation or isolation regions 130. The width of isolation region 130 is approximately equal to the minimum feature size for the photolithographic process used to create array 100.

The bipolar junction transistors are essentially vertical devices. For example, as best seen in FIG. 1, transistors 106 and 108 are formed in n-well 132 on p-type substrate 134. N-well 132 acts as the collector 107 for transistor 108. Further, a portion of source/drain region 126 acts as the base 105 for transistor 108. As mentioned above, emitter regions 113 and 115 are formed in source/drain regions 126 and 128, respectively. Thus, transistors 108 and 100 are vertical bipolar junction transistors.

In operation, the memory cells of array 100 store data as a voltage at the base of a bipolar junction transistor. For example, a low logic level is stored in memory cell 102 by applying a voltage to wordline 118 to activate transistor 106. The low logic level is represented by zero volts on bit line 116. Transistor 106 passes this voltage to the base 105 of transistor 108. Since transistor 108 is biased for the reverse base current effect, the current in transistor 108 is zero at a base voltage of zero volts. When transistor 106 is deactivated, the voltage on base 105 of transistor 108 remains unchanged and can be read out by use of a voltage sense amplifier on bit line 116.

Similarly, a high voltage can be written to transistor 108 by activating transistor 106 to pass a voltage of approximately 0.6 volts to the base 105 of transistor 108. Again, since transistor 108 is operating according to the reverse base current effect, the current in transistor 108 is approximately zero for the base voltage of 0.6 volts. Thus, when transistor 106 is turned off, the voltage of 0.6 volts stays with the base 105 of transistor 108. This voltage can be read out using a voltage sense amplifier coupled to bit line 116.

FIG. 3, 4, 5, 6, 7, 8, 9, 10 and 11 are cross sectional views of an embodiment of a portion of a memory array at various points during a fabrication process according to the teachings of the present invention. The fabrication process begins with a layer of semiconductor material 202, e.g., a p-type silicon wafer. Alternatively, layer 202 may comprise a layer of p-type semiconductor material as part of a semiconductor-on-insulator (SOI) structure. Layer 202 is processed to form n-well 204 such as by implanting n-type dopants in layer 202.

Figure 3:
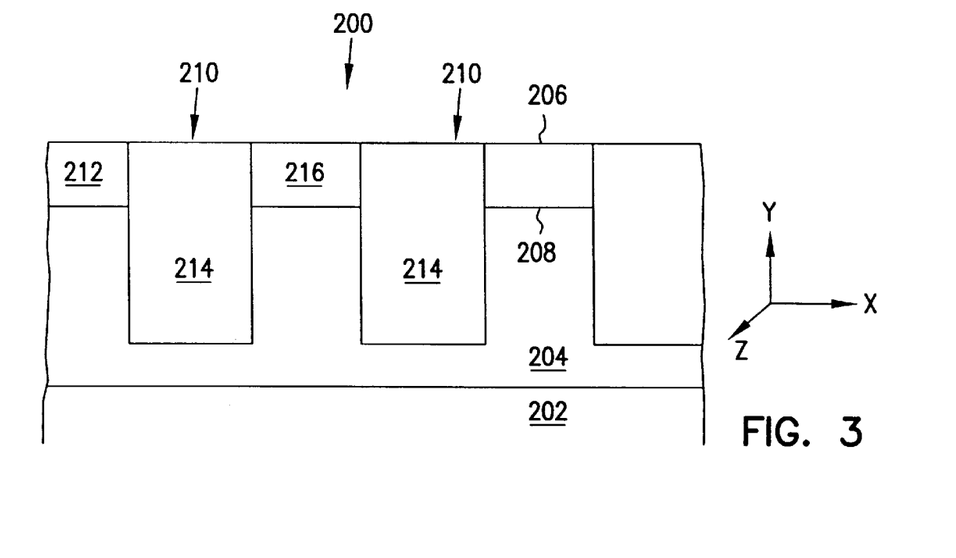
FIG. 3, 4, 5, 6, 7, 8, 9, 10 and 11 are cross sectional views of an embodiment of a portion of a memory array at various points during a fabrication process according to the teachings of the present invention.
Figure 4:
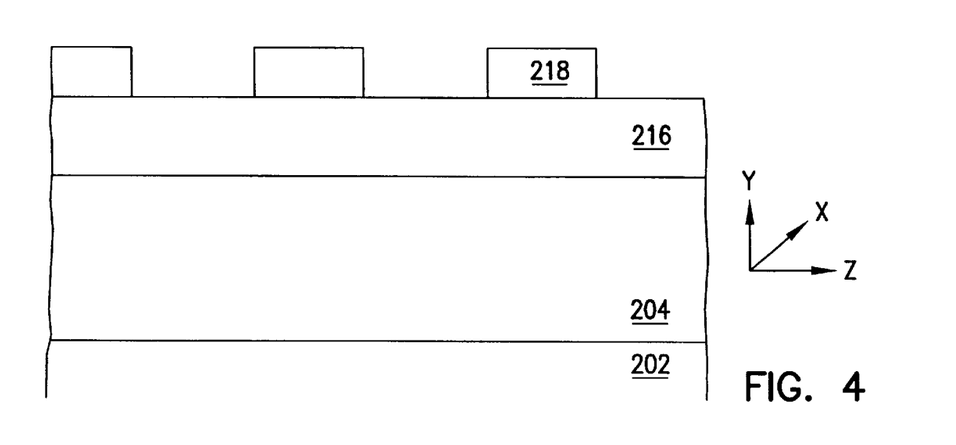

Active regions for memory cells are defined using two masks to define orthogonal stripe patterns as depicted in FIGS. 3 and 4. Pad layer 206 is deposited on working surface 208 of n-well 204. Pad layer 206 comprises, for example, silicon nitride ($Si_3N_4$). A photoresist layer (not shown) is applied and masked to define parallel stripes in the z-direction. These stripes of photoresist material are spaced apart by a minimum feature size (F). The portions of layer 206 that are exposed through the photoresist layer are etched. The etch process continues down into the underlying semiconductor material of n-well 204 to a depth of approximately 0.5 microns ($\mu$m).

The resist layer is removed. This etch process creates a series of parallel trenches 210 through n-well 204. Trenches 210 are filled, for example, with an insulator such as silicon dioxide and planarized with surface 212 of pad layer 206 using conventional chemical/mechanical polishing (CMP), or alternative planarization techniques such as with the abrasive carried within the polishing pad rather than in the slurry. Further, other planarization techniques that use Reactive Ion Etching or mechanical abrasion and a liquid without an active chemical component can also be used. The insulator material in trenches 210 acts as shallow trench isolation or isolation regions 214.

Figure 11:
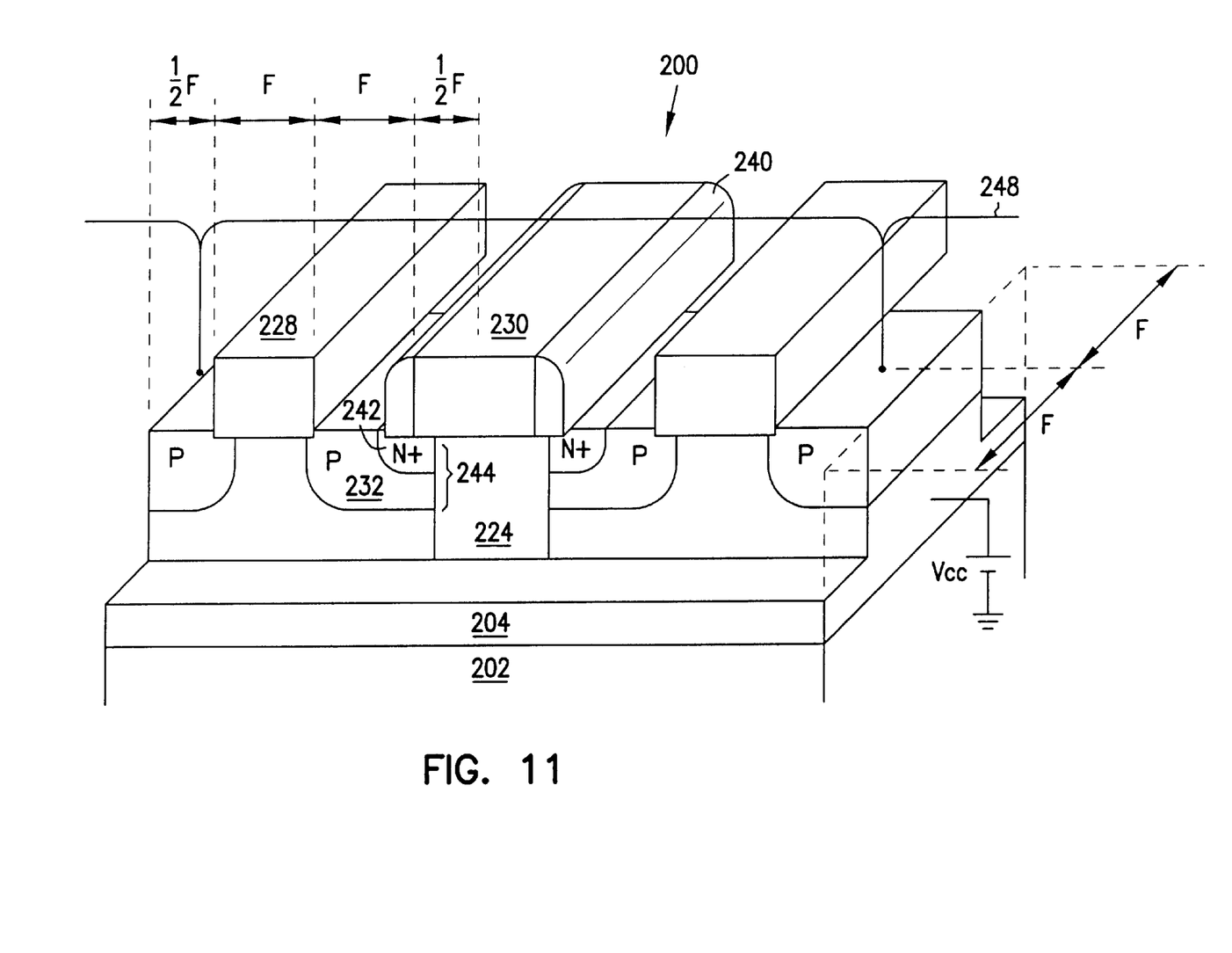

The second mask is used to define a stripe pattern in the orthogonal direction as depicted in FIG. 4. Pad layer 206 is removed. A thick pad layer 216 is formed by, for example, chemical vapor deposition of silicon nitride ($Si_3N_4$) to a thickness of approximately 0.3 $\mu$m. Photoresist layer 218 is deposited and patterned through a mask to define stripes in the x-direction, orthogonal to the stripes and isolation regions 214 defined in the previous process. Advantageously, the stripes in resist layer 218 define the location of wordlines, ground lines and a second set of isolation regions. This masking step thus allows the memory cells to be formed in an area as small as six feature squares as shown in FIG. 11.

Figure 5:
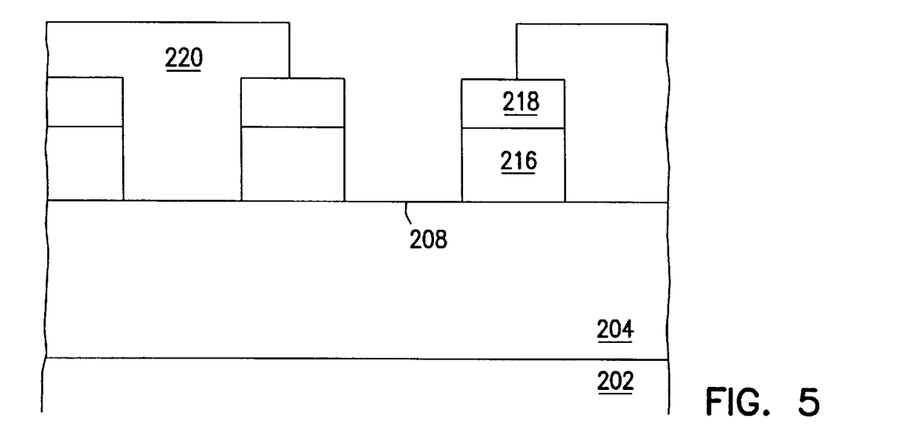

Isolation regions and the ground bus are formed through selected openings in resist layer 218. As shown in FIG. 5, layer 216 is etched through the openings in layer 218 down to expose the working surface 208 of n-well 204. Second photoresist layer 220 is formed and patterned to expose the selected openings in pad layer 216. These selected openings are used to create the isolation regions and the ground line or bus. The structure is as shown in FIG. 5.

The isolation regions are formed by etching the semiconductor material of n-well 204 in the openings in layer 216 to a depth of 0.5 $\mu$m to form trenches 222. Resist layers 218 and 220 are removed. An insulator layer, such as silicon dioxide, is deposited in trenches 222. The insulator layer is planarized using, for example, a CMP process stopping on a surface of pad layer 216. The insulator is further selectively etched to expose surfaces of n-well 204 in openings in layer 216. In the other openings in layer 216, the insulator is etched back to approximately the surface of n-well 204 so as to form shallow trench isolation or isolation regions 224. Together, isolation regions 224 and orthogonal isolation regions 214 define an array of isolated active regions within n-well 204. These active regions are used to define the location of the memory cells of array 200.

A gate insulator 226 is grown on the surfaces of n-well 204 that are exposed in openings of layer 216. Gate insulator layer 226 may be approximately 10 nanometers (rim) in thickness.

Figure 6:
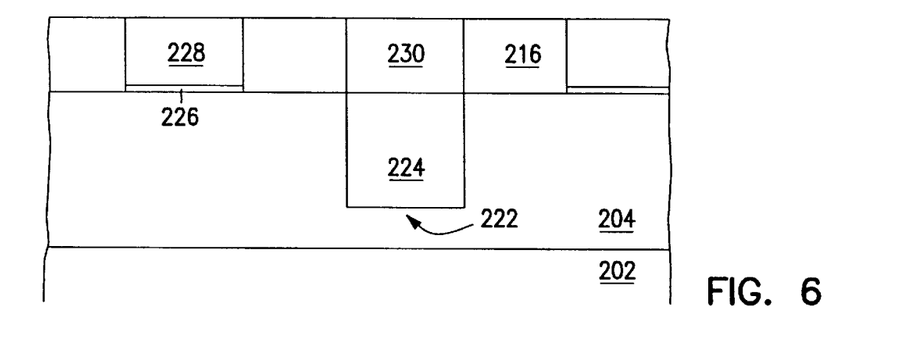

Wordlines 228 and and ground lines 230 are formed by, for example, chemical vapor deposition of polysilicon doped with a heavy concentration of n-type dopants. The polysilicon material is deposited with a thickness that is sufficient to fill the openings in layer 216. The polysilion is planarized back to a surface that is approximately parallel with the surface of layer 216 leaving a structure as shown in FIG. 6.

Polysilicon wordlines 228 and ground lines 230 are thermally oxidized to approximately 100 nm. The remaining portions of pad layer 216 are removed using, for example, phosphoric acid.

Source/drain regions 232 are formed, for example, by ion implantation of boron. It is noted that some of the source/drain regions will also house a bipolar junction transistor as described in more detail below. Also, a block mask can be used to expose array 200 and other regions that include p-channel devices.

Figure 7:
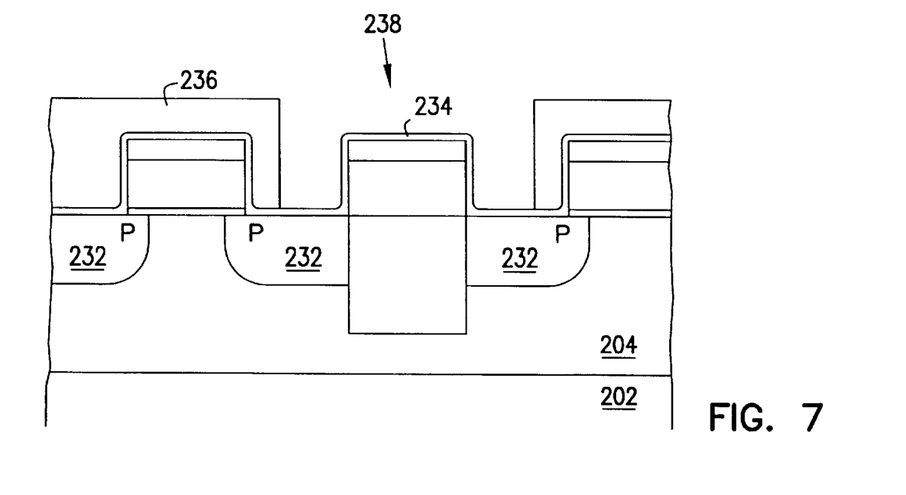

Layer 234 is formed, for example, by chemical vapor deposition of silicon nitride with a thickness of approximately 10 to 20 nm. Resist layer 236 is deposited and patterned to have openings 238 at the locations for formation of a vertical bipolar junction transistor as shown in FIG. 7.

The emitter regions of the bipolar junction transistors are formed by removing the portions of layer 234 exposed in openings 238. Resist layer 236 is removed. N+ polysilicon is deposited, e.g., by CVD, to a thickness of approximately 100 nm. The polysilicon is directionally etched to leave as spacers 240 on vertical surfaces only as shown in FIG. 8.

Figures 8, 9:
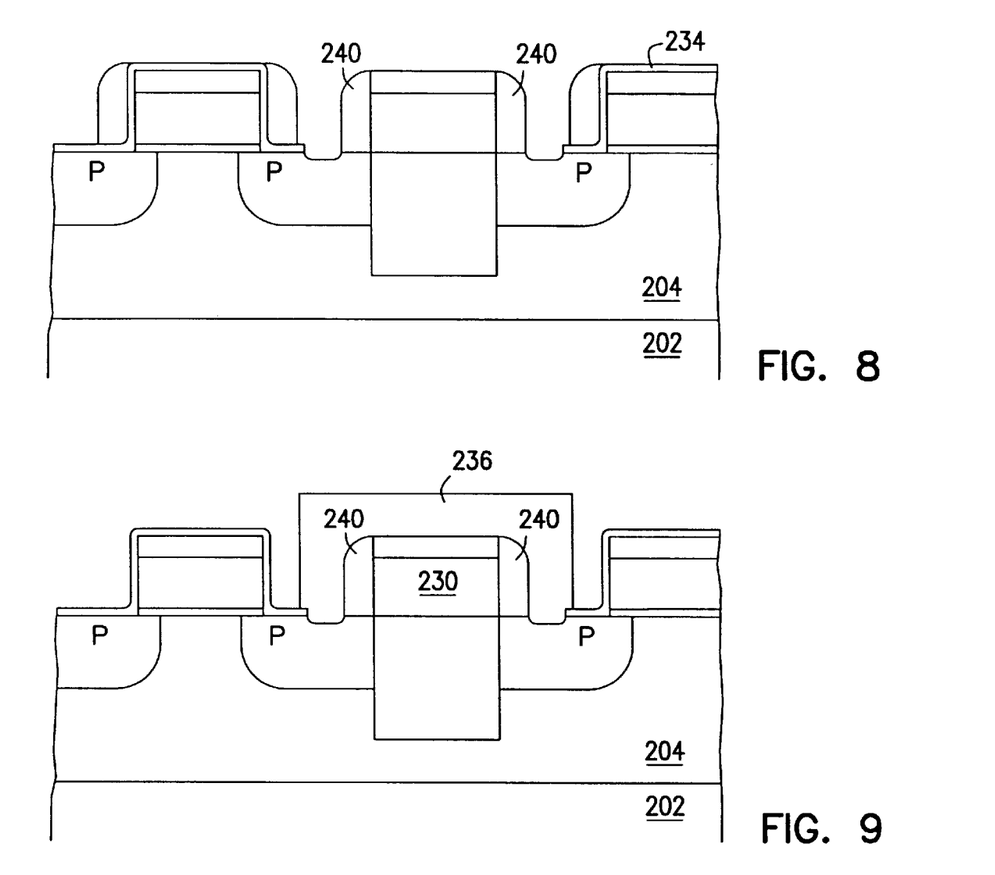

As shown in FIG. 9, another photoresist layer is deposited and patterned to cover ground lines 230 and adjacent spacers 240. The exposed spacers adjacent to wordlines 228 are removed. Emitter regions 242 are formed by performing an anneal to drive n-type dopants from spacers 240 into the adjacent source/drain regions 232.

Figure 10:
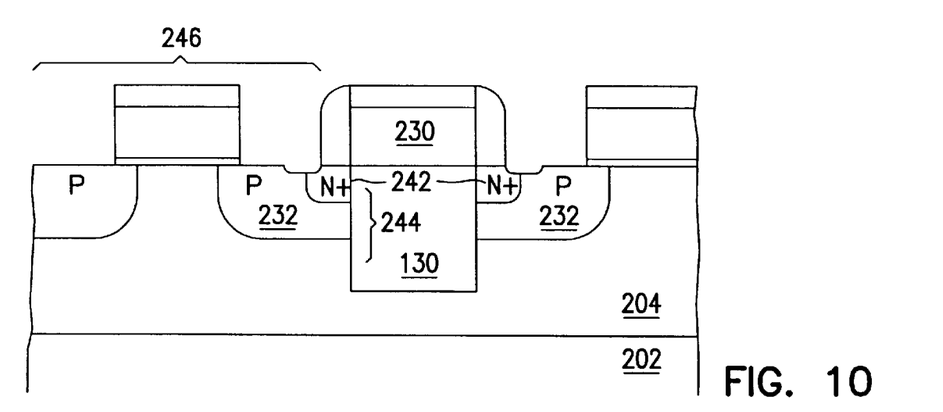

This process produces bipolar junction transistor 244 as shown in FIG. 10. The base of transistor 244 comprises a portion of source/drain region 232. The collector of transistor 244 comprises n-well 204. The process also produces p-channel transistor 246. The array 200 is completed by covering the structure with an insulator, e.g., by CVD of an oxide, using conventional processing techniques to form contacts and bit lines 248. The final structure is shown in FIG. 11.

Figure 12:
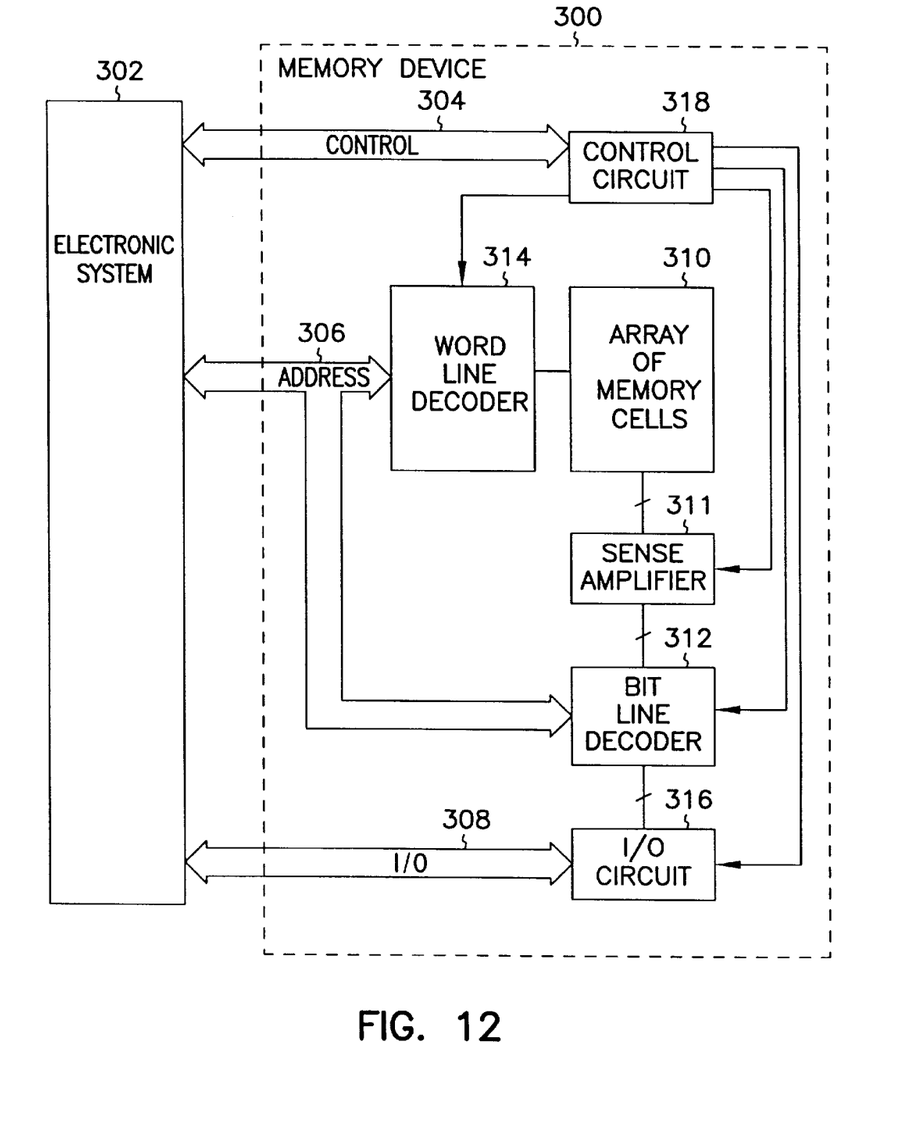
FIG. 12 is a block diagram of a system incorporating memory cells according to the teachings of the present invention.

FIG. 12 is a block diagram of an illustrative embodiment of the present invention. This embodiment includes memory device 300 that is coupled to electronic system 302 by control lines 304, address lines 306 and input/output (I/O) lines 308. Electronic system 302 comprises, for example, a microprocessor, a processor based computer, microcontroller, memory controller, a chip set or other appropriate system for reading and writing data in a memory device. Memory device 300 includes array of memory cells 310 that is coupled to word line decoder 314 and sense amplifier 311. Array of memory cells 310 is an array of SRAM cells that use the reverse base current effect to store data in a vertical bipolar device that is self-aligned with an isolation region such as the arrays shown and described above with respect to FIGS. 1 through 11.

Word line decoder 314 includes word line drivers that are coupled to word lines of array 310. Sense amplifier 311 is coupled to bit line decoder 312. Bit line decoder 312 and word line decoder 314 are coupled to address lines 306. Bit line decoder 312 is coupled to I/O circuit 316. I/O circuit 316 is coupled to I/O lines 308. Control circuit 318 is coupled to control lines 304, sense amplifier 3 11, word line decoder 314, bit line decoder 312, and I/O circuit 316.

In operation, electronic system 302 provides signals on address lines 306 and control lines 304 when data is to be read from or written to a cell of array 310. Word line decoder 314 determines the word line of a selected cell of array 310 using the address provided on address lines 306. Further, bit line decoder 312 determines the bit line of the selected cell of array 310. In a read operation, sense amplifier 311 detects the value stored in the selected cell based on bit lines of array 310. Sense amplifier 311 provides this voltage to I/O circuit 316 which, in turn, passes data to electronic system 302 over I/O lines 308. In a write operation, I/O circuit 316 passes data from I/O lines 308 to sense amplifier 312 for storage in the selected cell of array 310.

Conclusion

An improved memory cell has been described which uses a reduced surface area on the substrate by using a single mask to define the location of wordlines, ground buses and isolation regions with minimum dimension widths. Thus, a vertical bipolar transistor can be formed in a portion of a source/drain region of a field-effect transistor. The emitter of the bipolar transistor is self-aligned with a minimum dimension isolation region. This self-alignment allows a reduction in the size of the memory cell to approximately six feature squares.

In particular, an illustrative embodiment of the present invention includes a memory cell. The memory cell includes a field-effect transistor having first and second source/drain regions and a gate coupled to a wordline. The memory cell also includes a vertical bipolar junction transistor biased for use of the reverse base current effect to store data. The bipolar junction transistor has an emitter region formed within one of the source/drain regions of the field-effect transistor. The emitter region is self-aligned with a minimum dimension isolation region adjacent to the memory cell and is coupled to a ground line. A portion of the source/drain region acts as the base of the bipolar junction transistor.

In another embodiment, a method for fabricating a memory cell is provided. The method includes defining an active region in a layer of semiconductor material that is separated from other active regions by an isolation region. A wordline is formed through an opening in a masking layer used to define a part of the isolation region. A ground bus is formed parallel to the wordline and separated from the wordline by a minimum dimension. Source/drain regions are formed in the active region on opposite sides of the wordline. An emitter region is formed in one of the source/drain regions such that the emitter region is self-aligned with the isolation region.

In another embodiment, a method for fabricating an array of memory cells is provided. The method includes forming a first set of isolation regions in a layer of semiconductor material. The locations of wordlines, ground lines, and a second set of isolation regions are defined using a single mask, such that the wordlines, ground lines and second set of isolation regions are each orthogonal to the first set of isolation regions. The second set of isolation regions are formed to define active regions in the layer of semiconductor material. Wordlines and ground lines are formed. Source/drain regions are formed in the active region on opposite sides of each wordline. Emitter regions are formed in source/drain regions that are adjacent to one of the isolation regions of the second set of isolation regions. Each emitter region is self-aligned with one of the isolation regions of the second set of isolation regions.

In another embodiment, an electronic system is provided. The electronic system includes a processor and a memory. The memory is coupled to the processor. The memory includes an array of memory cells. The memory cells each include a field-effect transistor having first and second source/drain regions and a gate coupled to a wordline. The memory cells also include a vertical bipolar junction transistor biased for use of the reverse base current effect to store data and having an emitter region formed within a source/drain region of the field-effect transistor. The emitter region is self-aligned with an isolation region adjacent to the memory cell and is coupled to a ground line.

In another embodiment, a memory cell is provided. The memory cell includes a field-effect transistor having first and second source/drain regions and a gate coupled to a wordline. The memory cell also includes a minimum dimension isolation region that is formed adjacent to the first source/drain region. A vertical bipolar junction transistor is included and biased for use of the reverse base current effect to store data. The vertical bipolar junction transistor has an emitter region, collector region and base region. The emitter region is self-aligned with the minimum dimension isolation region within the first source/drain region. A minimum dimension ground line is formed on the isolation region and has a spacer defined region coupled to a side of the ground line and coupled to the emitter region. A bit line is coupled to the second source/drain region.

In another embodiment, a memory array is provided. The memory array includes a number of wordlines and a number of ground lines. The ground lines are formed parallel to and between adjacent wordlines. A number of bit lines are formed orthogonal to the wordlines. The memory array includes a number of memory cells located at the intersections of bit lines with wordlines. Each memory cell includes a field-effect transistor having first and second source/drain regions and a gate coupled to a wordline. The memory cell also includes a vertical bipolar junction transistor biased for use of the reverse base current effect to store data. The bipolar junction transistor has an emitter region formed within one of the source/drain regions of the field-effect transistor. The emitter region is self-aligned with a minimum dimension isolation region adjacent to the memory cell and is coupled to a ground line. A portion of the source/drain region acts as the base of the bipolar junction transistor.

In another embodiment, a method for fabricating a memory cell is provided. The method includes defining an active region in a layer of semiconductor material that is separated from other active regions by an isolation region. A wordline is formed through an opening in a masking layer used to define a part of the isolation region. A polysilicon ground bus is formed parallel to the wordline and separated from the wordline by a minimum dimension. Source/drain regions are formed in the active region on opposite sides of the wordline. Polysilicon sidewalls are formed on the ground bus. The sidewalls are annealed to drive n-type dopants from the polysilicon sidewalls into the adjacent source/drain region to form emitter regions.

In another embodiment, a method for fabricating an array of memory cells is provided. The method includes forming a first set of minimum dimension isolation regions in a layer of semiconductor material. The locations of wordlines, ground lines, and a second set of minimum dimension isolation regions are defined using a single mask, such that the wordlines, ground lines and second set of minimum dimension isolation regions are each orthogonal to the first set of minimum dimension isolation regions. The second set of minimum dimension isolation regions are formed to define active regions in the layer of semiconductor material. A layer of polysilicon is deposited over a masking layer. The polysilicon is planarized to fill trenches in the masking layer so as to produce wordlines and ground lines. Source/drain regions are formed in the active region on opposite sides of each wordline. Polysilicon spacers are formed along sidewalls of the ground lines. The polysilicon spacers are annealed to drive dopants from the sidewalls into the adjacent source/drain regions to form emitter regions. Each emitter region is self-aligned with one of the minimum dimension isolation regions of the second set of minimum dimension isolation regions.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. A memory cell, comprising:
   an isolation region that has a width that is substantially equal to a critical dimension of a photolithographic process used to form the isolation region;
   a field-effect transistor having first and second source/drain regions and a gate coupled to a wordline; and
   a vertical bipolar junction transistor biased for use of the reverse base current effect to store data and having an emitter region formed within one of the source/drain regions of the field-effect transistor, wherein the emitter region is self-aligned with the isolation region adjacent to the memory cell and is coupled to a ground line, a portion of the source/drain region acting as the base of the bipolar junction transistor.

2. The memory cell of claim 1, wherein the ground line comprises a polysilicon line formed on the isolation region and having a spacer defined region coupled to a side of the polysilicon line and coupled to the emitter region.

3. The memory cell of claim 1, wherein the memory cell is formed in an n-well formed in a p-type layer of semiconductor material.

4. The memory cell of claim 3, wherein the n-well forms the collector of the vertical bipolar junction transistor and is coupled to a positive voltage.

5. An electronic system, comprising:
   a processor;
   a memory, coupled to the processor, the memory including an array of memory cells wherein the memory cells, comprise:
   a field-effect transistor having first and second source/drain regions and a gate coupled to a wordline; and
   a vertical bipolar junction transistor biased for use of the reverse base current effect to store data and having an emitter region formed within a source/drain region of the field-effect transistor, wherein the emitter region is self-aligned with an isolation region adjacent to the memory cell and is coupled to a ground line, wherein the isolation region has a width that is substantially equal to a critical dimension of a photolithographic process used to form the isolation region.

6. The system of claim 5, wherein the ground line comprises a polysilicon line formed on the isolation region and having a spacer defined region coupled to a side of the polysilicon line and coupled to the emitter region.

7. The system of claim 5, wherein the memory cell is formed in an n-well formed in a p-type layer of semiconductor material.

8. The system of claim 7, wherein the n-well forms the collector of the vertical bipolar junction transistor and is coupled to a positive voltage.

9. A memory cell, comprising:
   a field-effect transistor having first and second source/drain regions and a gate coupled to a wordline;
   a isolation region formed adjacent to the first source/drain regions wherein the isolation region has a width that is substantially equal to a critical dimension of a photolithographic process used to form the isolation region;
   a vertical bipolar junction transistor biased for use of the reverse base current effect to store data and having an emitter region, collector region and base region;
   wherein the emitter region is self-aligned with the isolation region within the first source/drain region;
   a ground line formed on the isolation region and having a spacer defined region coupled to a side of the ground line and coupled to the emitter region; and
   a bit line coupled to the second source/drain region.

10. The memory cell of claim 9, wherein the memory cell is formed in an n-well formed in a p-type layer of semiconductor material.

11. The memory cell of claim 10, wherein the n-well forms the collector of the vertical bipolar junction transistor and is coupled to a positive voltage.

12. A memory array, comprising:
    a number of wordlines;
    a number of ground lines, wherein the ground lines are formed parallel to and separating adjacent wordlines;
    a number of bit lines, formed orthogonal to the wordlines; and
    a number of memory cells located at the intersections of bit lines with wordlines, each memory cell comprising:
    an isolation region that has a width that is substantially equal to a critical dimension of a photolithographic process used to form the isolation region;
    a field-effect transistor having first and second source/drain regions and a gate coupled to a wordline; and
    a vertical bipolar junction transistor biased for use of the reverse base current effect to store data and having an emitter region formed within one of the source/drain regions of the field-effect transistor, wherein the emitter region is self-aligned with a isolation region adjacent to the memory cell and is coupled to a ground line, a portion of the source/drain region acting as the base of the bipolar junction transistor.

13. The memory cell of claim 12, wherein the ground line comprises a polysilicon line formed on the isolation region and having a spacer defined region coupled to a side of the polysilicon line and coupled to the emitter region.

14. The memory cell of claim 12, wherein the memory cell is formed in an n-well formed in a p-type layer of semiconductor material.

15. The memory cell of claim 14, wherein the n-well forms the collector of the vertical bipolar junction transistor and is coupled to a positive voltage.

* * * * *

UNITED STATES PATENT AND TRADEMARK OFFICE
CERTIFICATE OF CORRECTION

PATENT NO.: 6,072,223
DATED: Jun. 6, 2000
INVENTOR(S): Noble

It is certified that errors appear in the above-identified patent and that said Patent is hereby corrected as shown below:

In column 2, delete lines 18 -57, beginning with "Memory" and ending with "technques.";

and insert the same wording in column 1, line 44 before the paragraph beginning with "Some researchers".

Signed and Sealed this

Thirteenth Day of February, 2001

Attest:

NICHOLAS P. GODICI

Attesting Officer     Acting Director of the United States Patent and Trademark Office